United States Patent
Lee

(10) Patent No.: US 9,659,611 B1
(45) Date of Patent: May 23, 2017

(54) SEMICONDUCTOR DEVICES AND SEMICONDUCTOR SYSTEMS INCLUDING THE SAME

(71) Applicant: SK hynix Inc., Icheon-si, Gyeonggi-do (KR)

(72) Inventor: Hyun Gyu Lee, Seoul (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/088,267

(22) Filed: Apr. 1, 2016

(30) Foreign Application Priority Data

Dec. 9, 2015 (KR) .......................... 10-2015-0175453

(51) Int. Cl.
| G11C 7/00 | (2006.01) |
| G11C 7/10 | (2006.01) |
| G11C 7/12 | (2006.01) |
| G11C 7/06 | (2006.01) |
| G11C 7/22 | (2006.01) |

(52) U.S. Cl.
CPC .............. *G11C 7/1063* (2013.01); *G11C 7/06* (2013.01); *G11C 7/1045* (2013.01); *G11C 7/1072* (2013.01); *G11C 7/1078* (2013.01); *G11C 7/12* (2013.01); *G11C 7/22* (2013.01); *G11C 7/1051* (2013.01)

(58) Field of Classification Search
CPC ....... G11C 7/22; G11C 7/1078; G11C 7/1072; G11C 7/1045; G11C 7/1051
USPC .......................................................... 365/191
See application file for complete search history.

(56) References Cited

U.S. PATENT DOCUMENTS

| 6,600,681 | B1 * | 7/2003 | Korger ................. G11C 7/1066 365/193 |
| 8,902,673 | B2 * | 12/2014 | Kim ..................... G11C 29/022 365/189.05 |
| 9,293,225 | B2 * | 3/2016 | Jeon .................... G11C 29/1201 |
| 9,324,390 | B2 * | 4/2016 | Jeon ....................... G11C 7/222 |
| 2011/0044120 | A1 | 2/2011 | Nakagawa et al. |
| 2013/0321022 | A1 * | 12/2013 | Ware ................. G01R 31/31726 324/762.01 |

FOREIGN PATENT DOCUMENTS

KR 101223537 B1 1/2013

* cited by examiner

*Primary Examiner* — Pho M Luu
(74) *Attorney, Agent, or Firm* — William Park & Associates Ltd.

(57) ABSTRACT

A semiconductor system includes a first semiconductor device and a second semiconductor device. The first semiconductor device outputs a command and a mask command. The second semiconductor device drives a first local line according to data on a first global line if a first mask write operation is performed in response to the command and the mask command. In addition, the second semiconductor device senses and amplifies data on a second local line if the first mask write operation is performed in response to the command and the mask command.

20 Claims, 10 Drawing Sheets

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C. 119(a) to Korean Patent Application No. 10-2015-0175453, filed on Dec. 9, 2015, which is incorporated herein by reference in its entirety.

BACKGROUND

1. Technical Field

Embodiments of the present disclosure relate to semiconductor devices configured to perform a data masking operation and semiconductor systems including semiconductor devices configured to perform a data masking operation.

2. Related Art

Generally, data input/output (I/O) lines may be used to transmit data in a semiconductor memory device. Data of memory cells included in a memory core of the semiconductor memory device may be transmitted to bit lines and may be sensed and amplified by sense amplifiers. The data loaded on the bit lines may be transmitted to global lines through local lines. Typically, the global lines may be globally disposed throughout a plurality of banks for data transmission between data pads and the memory core. Data transmission between the global lines and the local lines may be achieved by a certain circuit. In a dynamic random access memory (DRAM) device, sense amplifiers may be used to transmit the data on the local lines to the global lines during a read operation, and write drivers may be used to transmit the data on the global lines to the local lines during a write operation.

A semiconductor memory device may perform a masking operation to screen undesired data during the read operation or the write operation. That is, the masking operation may be used to selectively read out desired data among data stored in the semiconductor memory device or to selectively write only desired data into the semiconductor memory device.

SUMMARY

According to an embodiment, a semiconductor system includes a first semiconductor device and a second semiconductor device. The first semiconductor device outputs a command and a mask command. The second semiconductor device drives a first local line according to data on a first global line if a first mask write operation is performed in response to the command and the mask command. In addition, the second semiconductor device senses and amplifies data on a second local line if the first mask write operation is performed in response to the command and the mask command.

According to an embodiment, a semiconductor device includes a control signal generation circuit and a data input/output circuit. The control signal generation circuit generates a first write enable signal, a second write enable signal, a first read enable signal and a second read enable signal in response to a write signal, a read signal and an internal mask signal. The data input/output circuit drives first and second local lines according to data on first and second global lines in response to the first and second write enable signals. In addition, the data input/output circuit senses and amplifies data on the first and second local lines in response to the first and second read enable signals. If a first mask write operation is performed, the data input/output circuit drives the first local line according to data on the first global line in response to the first write enable signal and senses and amplifies data on the second local line in response to the second read enable signal.

According to an embodiment, a semiconductor device includes a first data input/output circuit and a second data input/output circuit. The first data input/output circuit drives a first local line according to data on a first global line in response to a first write enable signal and senses and amplifies data on the first local lines in response to a first read enable signal. The second data input/output circuit drives a second local line according to data on a second global line in response to a second write enable signal and senses and amplifies data on the second local line in response to a second read enable signals. The first write enable signal and the second read enable signal are enabled if a first mask write operation is performed.

According to an embodiment, a semiconductor device includes a command decoder, an internal mask signal generation circuit and a second semiconductor device. The command decoder receives a command. The internal mask signal generation circuit receives a mask command. The second semiconductor device drives a first local line according to data on a first global line if a first mask write operation is performed in response to the command and the mask command.

The second semiconductor device senses and amplifies data on a second local line if a first mask write operation is performed in response to the command and the mask command.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
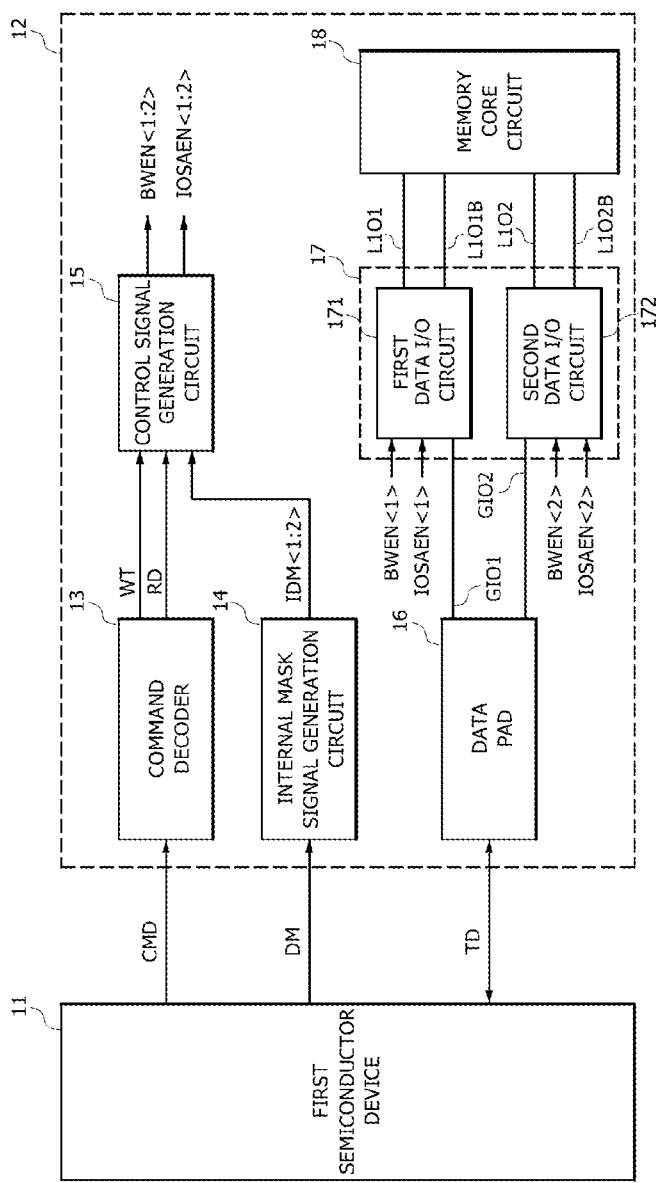
FIG. 1 is a block diagram illustrating a representation of an example of a configuration of a semiconductor system according to an embodiment.

Referring to FIG. 1, a semiconductor system according to an embodiment of the present disclosure may include a first semiconductor device 11 and a second semiconductor device 12.

The first semiconductor device 11 may output a command CMD and a mask command DM. The first semiconductor device 11 may receive or output transmission data TD. The command CMD may include a plurality of bits. The command CMD may include information on a write operation or a read operation of the second semiconductor device 12. According to the embodiments, the command CMD may be transmitted through a transmission line that transmits an address (not illustrated). The mask command DM may include information on a masking operation of the second semiconductor device 12. The mask command DM may be configured to include a plurality of bits, some of which respectively correspond to a first internal mask signal IDM<1> and a second internal mask signal IDM<2>. The mask command DM may be configured to include a plurality of bits, some of which correspond to data which are inputted or outputted through a first global line GIO1 and a second global line GIO2.

The second semiconductor device 12 may include a command decoder 13, an internal mask signal generation circuit 14, a control signal generation circuit 15, a data pad 16, a data input/output (I/O) circuit 17, and a memory core circuit 18.

The command decoder 13 may receive and decode the command CMD to generate a write signal WT and a read signal RD. The write signal WT may be generated to perform a write operation of the second semiconductor device 12. The read signal RD may be generated to perform a read operation of the second semiconductor device 12.

The internal mask signal generation circuit 14 may generate the first and second internal mask signals IDM<1:2> in response to the mask command DM. The first internal mask signal IDM<1> may be enabled if a mask operation to a first global line GIO1 is performed. The second internal mask signal IDM<2> may be enabled if a mask operation to a second global line GIO2 is performed.

The control signal generation circuit 15 may generate a first write enable signal BWEN<1>, a second write enable signal BWEN<2>, a first read enable signal IOSAEN<1> and a second read enable signal IOSAEN<2> in response to the write signal WT, the read signal RD, the first internal mask signal IDM<1> and the second internal mask signal IDM<2>. The first write enable signal BWEN<1> may be enabled if the write signal WT is enabled and the first internal mask signal IDM<1> is disabled. The second write enable signal BWEN<2> may be enabled if the write signal WT is enabled and the second internal mask signal IDM<2> is disabled. The first read enable signal IOSAEN<1> may be enabled if the read signal RD is enabled. The first read enable signal IOSAEN<1> may be enabled if the write signal WT and the first internal mask signal IDM<1> are enabled to perform a mask operation to the first global line GIO1. The second read enable signal IOSAEN<2> may be enabled if the read signal RD is enabled. The second read enable signal IOSAEN<2> may be enabled if the write signal WT and the second internal mask signal IDM<2> are enabled to perform a mask operation to the second global line GIO2.

The control signal generation circuit 15 may generate the first write enable signal BWEN<1> and the second write enable signal BWEN<2> which are enabled during a write operation that drives a first local line LIO1 and a first inversion local line LIO1B according to data on the first global line GIO1 and drives a second local line LIO2 and a second inversion local line LIO2B according to data on the second global line GIO2.

The control signal generation circuit 15 may generate the first write enable signal BWEN<1> and the second read enable signal IOSAEN<2> which are enabled during a first mask write operation that drives the first local line LIO1 and the first inversion local line LIO1B according to data on the first global line GIO1, blocks an operation of driving the second local line LIO2 and the second inversion local line LIO2B according to data on the second global line GIO2, and senses and amplifies data on the second local line LIO2 and the second inversion local line LIO2B.

The control signal generation circuit 15 may generate the first read enable signal IOSAEN<1> and the second write enable signal BWEN<2> which are enabled during a second mask write operation that blocks an operation of driving the first local line LIO1 and the first inversion local line LIO1B according to data on the first global line GIO1, senses and amplifies data on the first local line LIO1 and the first inversion local line LIO1B, and drives the second local line LIO2 and the second inversion local line LIO2B according to data on the second global line GIO2.

The control signal generation circuit 15 may generate the first read enable signal IOSAEN<1> and the second read enable signal IOSAEN<2> which are enabled during a read operation that senses and amplifies data on the first local line LIO1 and the first inversion local line LIO1B, drives the first global line GIO1 according to data on the first local line LIO1 and the first inversion local line LIO1B, senses and amplifies data on the second local line LIO2 and the second inversion local line LIO2B, and drives the second global line G102 according to data on the second local line LIO2 and the second inversion local line LIO2B.

The data pad 16 may receive the transmission data TD to transmit the transmission data TD to the first global line GIO1 and the second global line GIO2 or may output the data on the first global line GIO1 and the second global line GIO2 as the transmission data TD.

The data I/O circuit 17 may include a first data I/O circuit 171 and a second data I/O circuit 172.

If the first write enable signal BWEN<1> is enabled, the first data I/O circuit 171 may drive the first local line LIO1 and the first inversion local line LIO1B according to data on the first global line GIO1. If the first read enable signal IOSAEN<1> is enabled, the first data I/O circuit 171 may sense and amplify data on the first local line LIO1 and the first inversion local line LIO1B. If the first write enable signal BWEN<1> is enabled during a write operation and a first mask write operation, the first data I/O circuit 171 may drive the first local line LIO1 and the first inversion local line LIO1B according to the data on the first global line GIO1. The first data I/O circuit 171 may sense and amplify data on the first local line LIO1 and the first inversion local line LIO1B in response to the first read enable signal IOSAEN<1> which is enabled during a read operation and a second mask write operation and may drive the first global line GIO1 according to the data on the first local line LIO1 and the first inversion local line LIO1B.

If the second write enable signal BWEN<2> is enabled, the second data I/O circuit 172 may drive the second local line LIO2 and the second inversion local line LIO2B according to the data on the second global line GIO2. If the second read enable signal IOSAEN<2> is enabled, the second data I/O circuit 172 may sense and amplify data on the second local line LIO2 and the second inversion local line LIO2B. If the second write enable signal BWEN<2> is enabled during the write operation and the second mask write operation, the second data I/O 172 circuit may drive the second local line LIO2 and the second inversion local line LIO2B according to the data on the second global line GIO2. The second data I/O circuit 172 may sense and amplify data on the second local line LIO2 and the second inversion local line LIO2B in response to the second read enable signal IOSAEN<2> which is enabled during the read operation and the first mask write operation and may drive the second global line G1O2 according to the data on the second local line LIO2 and the second inversion local line LIO2B.

The memory core circuit 18 may include bit lines (not illustrated) which are coupled to the first local line LIO1, the first inversion local line LIO1B, the second local line LIO2, and the second inversion local line LIO2B. If the write operation is performed, the memory core circuit 18 may transfer the data on the first local line LIO1 and the first inversion local line LIO1B to a first bit line pair (not illustrated) to store the data in a first memory cell (not illustrated) and may transfer the data on the second local line LIO2 and the second inversion local line LIO2B to a second bit line pair (not illustrated) to store the data in a second memory cell (not illustrated). If the read operation is performed, charge sharing between the first memory cell (not illustrated) and the first bit line pair (not illustrated) may occur and the first bit line (not illustrated) may share electric charges with the first local line LIO1 again. In addition, if the read operation is performed, charge sharing between the second memory cell (not illustrated) and the second bit line pair (not illustrated) may occur and the second bit line (not illustrated) may share electric charges with the second local line LIO2 again.

Figure 2:
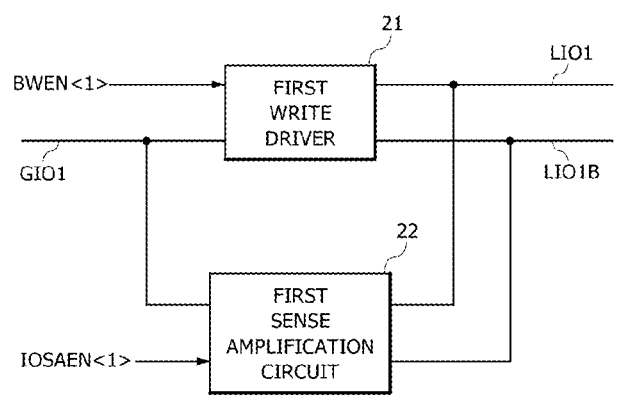
FIG. 2 is a block diagram illustrating a representation of an example of a first data input/output circuit included in the semiconductor system of FIG. 1.

Referring to FIG. 2, the first data I/O circuit 171 may include a first write driver 21 and a first sense amplification circuit 22.

The first write driver 21 may drive the first local line LIO1 and the first inversion local line LIO1B according to the data on the first global line GIO1 in response to the first write enable signal BWEN<1>. For example, if the first write enable signal BWEN<1> is enabled and data on the first global line GIO1 has a logic high level, the first write driver 21 may drive the first local line LIO1 to a logic high level and may drive the first inversion local line LIO1B to a logic low level. If the first write enable signal BWEN<1> is enabled and data on the first global line GIO1 has a logic low level, the first write driver 21 may drive the first local line LIO1 to a logic low level and may drive the first inversion local line LIO1B to a logic high level. The logic levels of the first local line LIO1 and the first inversion local line LIO1B driven according to the logic level of the first global line GIO1 may be set to be different according to the embodiments. If the first write enable signal BWEN<1> is disabled, the first write driver 21 may stop an operation that the first local line LIO1 and the first inversion local line LIO1B are driven according to the data on the first global line GIO1.

The first sense amplification circuit 22 may sense and amplify the data on the first local line LIO1 and the first inversion local line LIO1B in response to the first read enable signal IOSAEN<1> and may drive the first global line GIO1 according to the data on the first local line LIO1 and the first inversion local line LIO1B. For example, if a memory cell (not illustrated) in the memory core circuit 18 (see FIG. 1) shares electric charges with the first local line LIO1 or the first inversion local line LIO1B during a read operation or a write operation, the first sense amplification circuit 22 may sense and amplify data on the first local line LIO1 and the first inversion local line LIO1B. The first sense amplification circuit 22 may receive the data on the first local line LIO1 and the first inversion local line LIO1B to drive the first global line GIO1. If the data on the first local line LIO1 is amplified to have a logic high level and the data on the first inversion local line LIO1B is amplified to have a logic low level, the first sense amplification circuit 22 may drive the first global line GIO1 to a logic high level. If the data on the first local line LIO1 is amplified to have a logic low level and the data on the first inversion local line LIO1B is amplified to have a logic high level, the first sense amplification circuit 22 may drive the first global line GIO1 to a logic low level. The logic level of the first global line GIO1 driven according to the logic levels of the first local line LIO1 and the first inversion local line LIO1B may be set to be different according to the embodiments.

Figure 3:
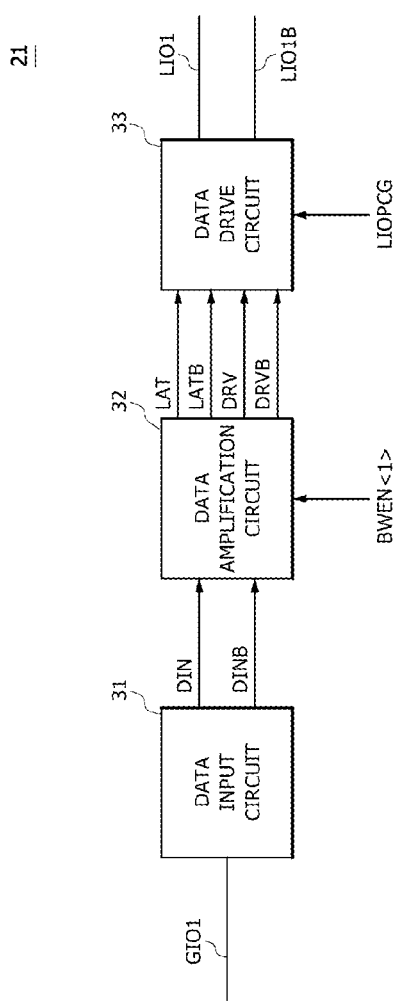
FIG. 3 is a block diagram illustrating a representation of an example of a first write driver included in the first data input/output circuit of FIG. 2.

Referring to FIG. 3, the first write driver 21 may include a data input circuit 31, a data amplification circuit 32, and a data drive circuit 33.

The data input circuit 31 may receive the data on the first global line GIO1 to generate input data DIN and inverted input data DINB. If data having a logic high level is transmitted through the first global line GIO1, the data input circuit 31 may generate the input data DIN having a logic high level and the inverted input data DINB having a logic low level. If data having a logic low level is transmitted through the first global line GIO1, the data input circuit 31 may generate the input data DIN having a logic low level and the inverted input data DINB having a logic high level. The logic levels of the input data DIN and the inverted input data DINB, which are generated according to the data on the first global line GIO1, may be set to be different according to the embodiments.

The data amplification circuit 32 may generate latch data LAT, inverted latch data LATB, drive data DRV, and inverted drive data DRVB according to the input data DIN and the inverted input data DINB, in response to the first write enable signal BWEN<1>. If the first write enable signal BWEN<1> is enabled, the data amplification circuit 32 may generate the latch data LAT having a logic low level, the inverted latch data LATB having a logic high level, the drive data DRV having a logic low level and the inverted drive data DRVB having a logic high level in response to the input data DIN having a logic high level and the inverted input data DINB having a logic low level. If the first write enable signal BWEN<1> is enabled, the data amplification circuit 32 may generate the latch data LAT having a logic high level, the inverted latch data LATB having a logic low level, the drive data DRV having a logic high level and the inverted drive data DRVB having a logic low level in response to the input data DIN having a logic low level and the inverted input data DINB having a logic high level. The logic levels of the latch data LAT, the inverted latch data LATB, the drive data DRV and the inverted drive data DRVB, which are generated according to the input data DIN and the inverted input data DINB, may be set to be different according to the embodiments.

The data drive circuit 33 may drive the first local line LIO1 and the first inversion local line LIO1B according to the latch data LAT, the inverted latch data LATB, the drive data DRV and the inverted drive data DRVB, in response to a write precharge signal LIOPCG. The write precharge signal LIOPCG may be set to be enabled before a write operation is performed and may be set to be disabled if a write operation is performed. If the write precharge signal LIOPCG is enabled, the data drive circuit 33 may precharge the first local line LIO1 and the first inversion local line LIO1B with a precharge voltage. A level of the precharge voltage may be set to be different according to the embodiments. If the write precharge signal LIOPCG is disabled, the data drive circuit 33 may drive the first local line LIO1 and the first inversion local line LIO1B according to the latch data LAT, the inverted latch data LATB, the drive data DRV and the inverted drive data DRVB. If the write precharge signal LIOPCG is disabled, the data drive circuit 33 may drive the first local line LIO1 to a logic high level and the first inversion local line LIO1B to a logic low level in response to the latch data LAT having a logic low level, the inverted latch data LATB having logic high level, the drive data DRV having a logic low level and a the inverted drive data DRVB having a logic high level. If the write precharge signal LIOPCG is disabled, the data drive circuit 33 may drive the first local line LIO1 to a logic low level and the first inversion local line LIO1B to a logic high level in response to the latch data LAT having a logic high level, the inverted latch data LATB having logic low level, the drive data DRV having a logic high level and a the inverted drive data DRVB having a logic low level. The logic levels of the first local line LIO1 and the first inversion local line LIO1B, which are driven according to the latch data LAT, the inverted latch data LATB, the drive data DRV and the inverted drive data DRVB, may be set to be different according to the embodiments.

Figure 4:
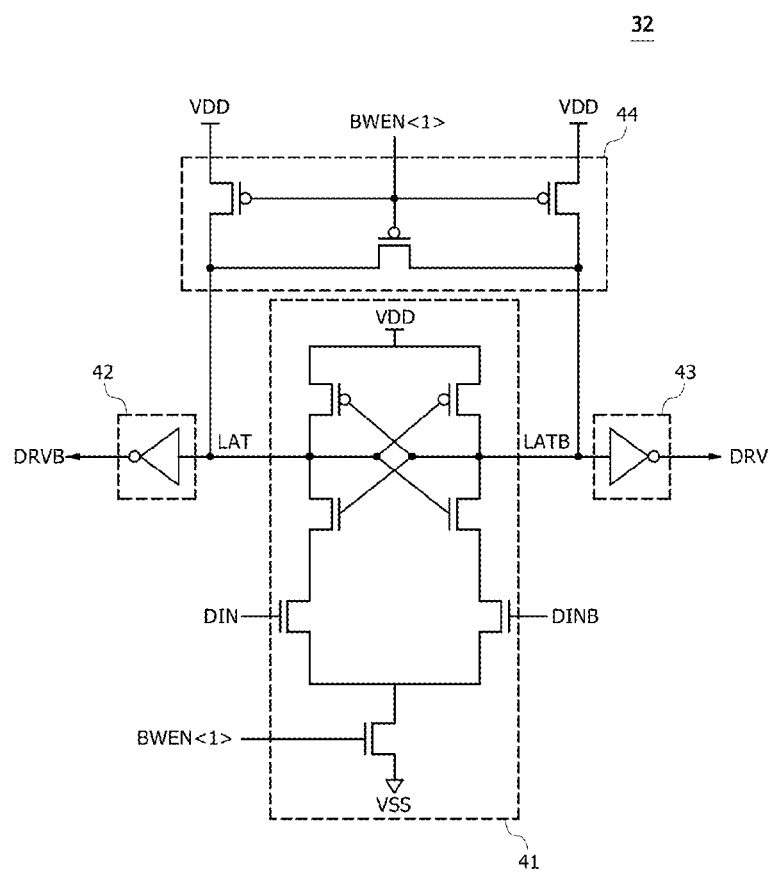
FIG. 4 is a circuit diagram illustrating a representation of an example of a data amplification circuit included in the first write driver of FIG. 3.

Referring to FIG. 4, the data amplification circuit 32 may include a data sensing circuit 41, a first inversion buffer circuit 42, a second inversion buffer circuit 43, and a reset circuit 44.

The data sensing circuit 41 may generate the latch data LAT and the inverted latch data LATB according to the input data DIN and the inverted input data DINB in response to the first write enable signal BWEN<1>. If the first write enable signal BWEN<1> is enabled to have a logic high level, the data sensing circuit 41 may receive the input data DIN having a logic high level and the inverted input data DINB having a logic low level to generate the latch data LAT having a logic low level and the inverted latch data LATB having a logic high level. If the first write enable signal BWEN<1> is enabled to have a logic high level, the data sensing circuit 41 may receive the input data DIN having a logic low level and the inverted input data DINB having a logic high level to generate the latch data LAT having a logic high level and the inverted latch data LATB having a logic low level.

The first inversion buffer circuit 42 may inversely buffer the latch data LAT to generate the inverted drive data DRVB.

The second inversion buffer circuit 43 may inversely buffer the inverted latch data LATB to generate the drive data DRV.

The reset circuit 44 may drive the latch data LAT and the inverted latch data LATB in response to the first write enable signal BWEN<1>. If the first write enable signal BWEN<1> is disabled to have a logic low level, the reset circuit 44 may drive the latch data LAT and the inverted latch data LATB to have a logic high level.

The rest circuit 44 and the data sensing circuit 41 may be configured to receive a power supply voltage VDD. The data sending circuit 41 may be coupled to a ground voltage VSS.

Figure 5:
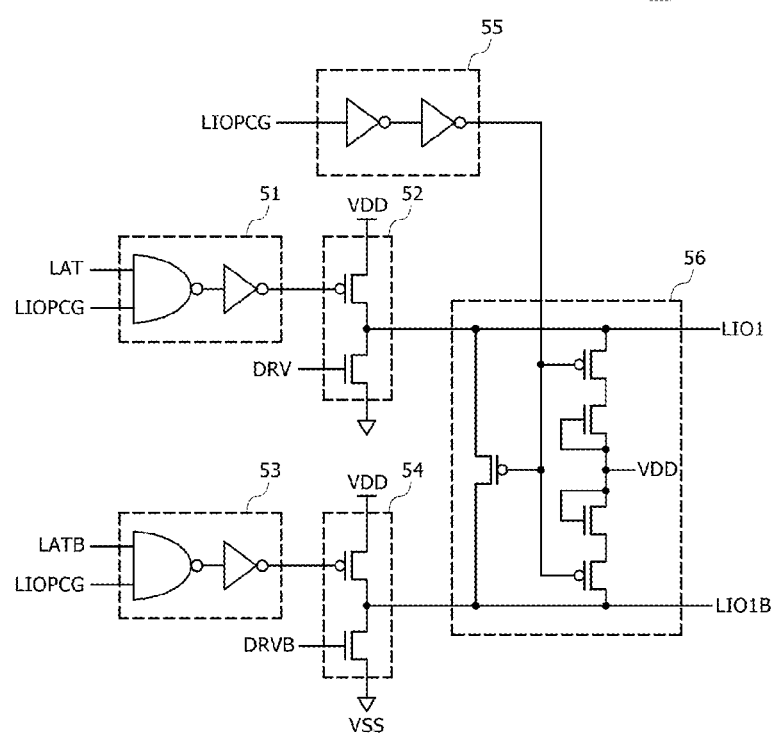
FIG. 5 is a circuit diagram illustrating a representation of an example of a data drive circuit included in the first write driver of FIG. 3.

Referring to FIG. 5, the data drive circuit 33 may include a first logic circuit 51, a local line drive circuit 52, a second logic circuit 53, an inversion local line drive circuit 54, a buffer circuit 55, and an equalization circuit 56.

The first logic circuit 51 may execute an AND operation of the latch data LAT and the write precharge signal LIOPCG and may output the result of the AND operation. If the write precharge signal LIOPCG is enabled to have a logic low level, the first logic circuit 51 may output a signal having a logic low level. If the write precharge signal LIOPCG is disabled to have a logic high level, the first logic circuit 51 may buffer the latch data LAT and may output the buffered latch data as an output signal.

The local line drive circuit 52 may receive an output signal of the first logic circuit 51 and the drive data DRV to drive the first local line LIO1. If the output signal of the first logic circuit 51 has a logic low level and the drive data DRV has a logic low level, the local line drive circuit 52 may drive the first local line LIO1 to a logic high level. If the output signal of the first logic circuit 51 has a logic high level and the drive data DRV has a logic high level, the local line drive circuit 52 may drive the first local line LIO1 to a logic low level. The local line drive circuit 52 may be configured to receive a power supply voltage VDD.

The second logic circuit 53 may execute an AND operation of the inverted latch data LATB and the write precharge signal LIOPCG and may output the result of the AND operation. If the write precharge signal LIOPCG is enabled to have a logic low level, the second logic circuit 53 may output a signal having a logic low level. If the write precharge signal LIOPCG is disabled to have a logic high level, the second logic circuit 53 may buffer and output the inverted latch data LATB.

The inversion local line drive circuit 54 may receive an output signal of the second logic circuit 53 and the inverted drive data DRVB to drive the first inversion local line LIO1B. If the output signal of the second logic circuit 53 has a logic low level and the inverted drive data DRVB has a logic low level, the inversion local line drive circuit 54 may drive the first inversion local line LIO1B to a logic high level. If the output signal of the second logic circuit 53 has a logic high level and the inverted drive data DRVB has a logic high level, the inversion local line drive circuit 54 may drive the first inversion local line LIO1B to a logic low level. The inversion local line drive circuit 54 may be configured to receive a power supply voltage VDD and a ground voltage VSS.

The buffer circuit 55 may buffer the write precharge signal LIOPCG to supply the buffered write precharge signal to the equalization circuit 56.

The equalization circuit 56 may precharge the first local line LIO1 and the first inversion local line LIO1B in response to the buffered write precharge signal LIOPCG. For example, the equalization circuit 56 may precharge the first local line LIO1 and the first inversion local line LIO1B with a power supply voltage VDD, if the write precharge signal LIOPCG is enabled to have a logic low level. A voltage level of the first local line LIO1 and the first inversion local line LIO1B, which are precharged in response to the write precharge signal LIOPCG, may be set to be different according to the embodiments.

Figure 6:
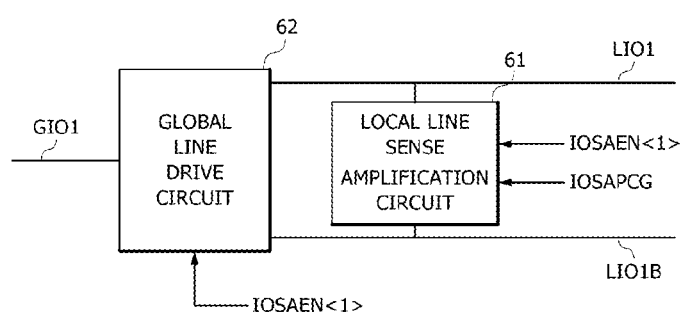
FIG. 6 is a block diagram illustrating a representation of an example of a first sense amplification circuit included in the first data input/output circuit of FIG. 2.

Referring to FIG. 6, the first sense amplification circuit 22 may include a local line sense amplification circuit 61 and a global line drive circuit 62.

The local line sense amplification circuit 61 may sense and amplify data on the first local line LIO1 and the first inversion local line LIO1B in response to the first read enable signal IOSAEN<1> and a read precharge signal IOSAPCG. The read precharge signal IOSAPCG may be set to be enabled before a read operation is performed and may be set to be disabled if the read operation is performed. If the first read enable signal IOSAEN<1> is enabled and the read precharge signal IOSAPCG is disabled, the read operation or the write operation is performed, and thereby the local line sense amplification circuit 61 may sense and amplify data loaded on the first local line LIO1 and the first inversion local line LIO1B during a read operation or a write operation.

The global line drive circuit 62 may receive the data on the first local line LIO1 and the first inversion local line LIO1B to drive the first global line GIO1 in response to the first read enable signal IOSAEN<1>. If the first read enable signal IOSAEN<1> is enabled, data having a logic high level is transmitted through the first local line LIO1, and data having a logic low level is transmitted through the first inversion local line LIO1B, the global line drive circuit 62 may drive the first global line GIO1 to a logic high level. If the first read enable signal IOSAEN<1> is enabled, data having a logic low level is transmitted through the first local line LIO1, and data having a logic high level is transmitted through the first inversion local line LIO1B, the global line drive circuit 62 may drive the first global line GIO1 to a logic low level. The logic level of the first global line GIO1 driven according to the first local line LIO1 and the first inversion local line LIO1B may be set to be different according to the embodiments.

Figure 7:
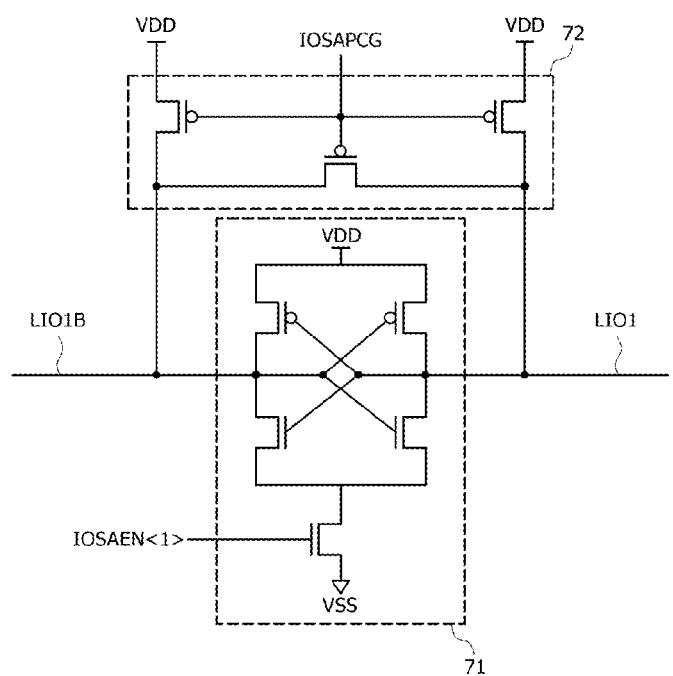
FIG. 7 is a circuit diagram illustrating a representation of an example of a local line sense amplification circuit included in the first sense amplification circuit of FIG. 6.

Referring to FIG. 7, the local line sense amplification circuit 61 may include a latch circuit 71 and a precharge circuit 72.

The latch circuit 71 may sense and amplify data on the first local line LIO1 and the first inversion local line LIO1B in response to the first read enable signal IOSAEN<1>. The latch circuit 71 may sense and amplify a voltage difference between the first local line LIO1 and the first inversion local line LIO1B. The latch circuit 71 may be realized using a cross-coupled latch circuit. In some embodiments, the latch circuit 71 may be realized using one of various circuits that senses and to amplifies a voltage difference between the first local line LIO1 and the first inversion local line LIO1B.

The precharge circuit 72 may precharge the first local line LIO1 and the first inversion local line LIO1B with the power supply voltage VDD in response to the read precharge signal IOSAPCG. The precharge circuit 72 may precharge the first local line LIO1 and the first inversion local line LIO1B with the power supply voltage VDD in response to the read precharge signal IOSAPCG which is enabled to have a logic low level. The precharge circuit 72 may terminate the precharge operation of the first local line LIO1 and the first inversion local line LIO1B in response to the read precharge signal IOSAPCG which is disabled to have a logic high level. The latch circuit 71 may be configured to receive a power supply voltage VDD and a ground voltage VSS.

Figure 8:
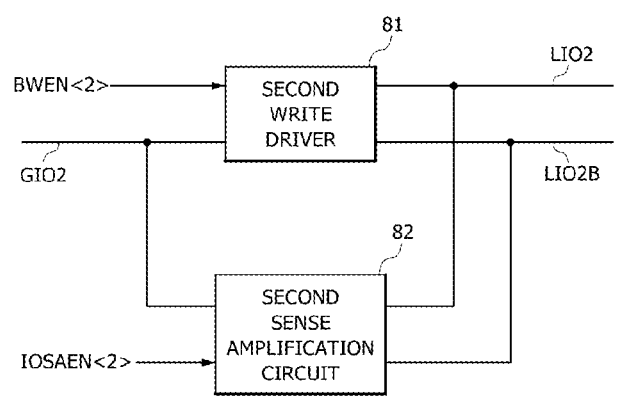
FIG. 8 is a block diagram illustrating a representation of an example of a second data input/output circuit included in the semiconductor system of FIG. 1.

Referring to FIG. 8, the second data I/O circuit 172 may include a second write driver 81 and a second sense amplification circuit 82.

The second write driver 81 may drive the second local line LIO2 and the second inversion local line LIO2B according to the data on the second global line GIO2 in response to the second write enable signal BWEN<2>. For example, if the second write enable signal BWEN<2> is enabled and data having a logic high level is transmitted through the second global line GIO2, the second write driver 81 may drive the second local line LIO2 to a logic high level and may drive the second inversion local line LIO2B to a logic low level. If the second write enable signal BWEN<2> is enabled and data having a logic low level is transmitted through the second global line GIO2, the second write driver 81 may drive the second local line LIO2 to a logic low level and may drive the second inversion local line LIO2B to a logic high level. The logic levels of data on the second local line LIO2 and the second inversion local line LIO2B driven according to the logic level of the second global line G1O2 may be set to be different according to the embodiments. If the second write enable signal BWEN<2> is disabled, the second write driver 81 may terminate an operation that the second local line LIO2 and the second inversion local line LIO2B are driven according to the data on the second global line GIO2. The second write driver 81 may have the same configuration as the first write driver 21 described above except for the I/O lines and the I/O signals. Thus, detailed descriptions of the second write driver 81 will be omitted hereinafter.

The second sense amplification circuit 82 may sense and amplify data on the second local line LIO2 and the second inversion local line LIO2B in response to the second read enable signal IOSAEN<2> and may drive the second global line G1O2 according to the data on the second local line LIO2 and the second inversion local line LIO2B. For example, if a memory cell (not illustrated) included in the memory core circuit 18 shares electric charges with the second local line LIO2 or the second inversion local line LIO2B during a read operation or a write operation, the second sense amplification circuit 82 may sense and amplify data on the second local line LIO2 and the second inversion local line LIO2B. The second sense amplification circuit 82 may receive the data on the second local line LIO2 and the second inversion local line LIO2B to drive the second global line GIO2. If the data on the second local line LIO2 is amplified to have a logic high level and the data on the second inversion local line LIO2B is amplified to have a logic low level, the second sense amplification circuit 82 may drive the second global line GIO2 to a logic high level. If the data on the second local line LIO2 is amplified to have a logic low level and the data on the second inversion local line LIO2B is amplified to have a logic high level, the second sense amplification circuit 82 may drive the second global line GIO2 to a logic low level. The logic level of data on the second global line G1O2 driven according to the logic levels of the second local line LIO2 and the second inversion local line LIO2B may be set to be different according to the embodiments. The second sense amplification circuit 82 may have the same configuration as the first sense amplification circuit 22 described above except for the I/O lines and the I/O signals. Thus, detailed descriptions of the second sense amplification circuit 82 will be omitted hereinafter.

Figure 9:
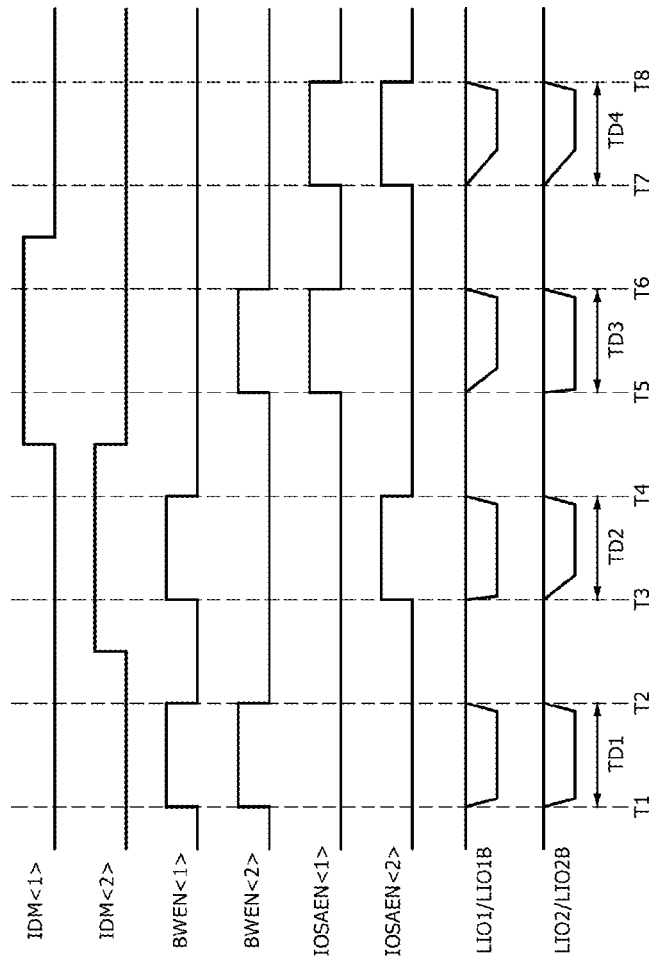
FIG. 9 is a timing diagram illustrating a representation of an example of an operation of the semiconductor system illustrated in FIGS. 1 to 8.

FIG. 9 is a timing diagram illustrating relationships between various signals generated or provided while the write operation, the first mask write operation, the second mask write operation and the read operation are performed.

First, if the write operation is performed during a first time period TD1 between a point of time T1 and a point of time T2, the first write enable signal BWEN<1> enabled to have a logic high level and the first read enable signal IOSAEN<1> disabled to have a logic low level may be generated in response to the first internal mask signal IDM<1> disabled to have a logic low level and the second write enable signal BWEN<2> enabled to have a logic high level and the second read enable signal IOSAEN<2> disabled to have a logic low level may be generated in response to the second internal mask signal IDM<2> disabled to have a logic low level. The first data I/O circuit 171 may drive the first local line LIO1 and the first inversion local line LIO1B according to the data on the first global line GIO1 in response to the first write enable signal BWEN<1> which is enabled. The second data I/O circuit 172 may drive the second local line LIO2 and the second inversion local line LIO2B according to the data on the second global line G1O2 in response to the second write enable signal BWEN<2> which is enabled.

Subsequently, if the first mask write operation is performed during a second time period TD2 between a point of time T3 and a point of time T4, the first write enable signal BWEN<1> enabled to have a logic high level and the first read enable signal IOSAEN<1> disabled to have a logic low level may be generated in response to the first internal mask signal IDM<1> which is disabled to have a logic low level and the second write enable signal BWEN<2> disabled to have a logic low level and the second read enable signal IOSAEN<2> enabled to have a logic high level may be generated in response to the second internal mask signal IDM<2> which is enabled to have a logic high level. The first data I/O circuit 171 may drive the first local line LIO1 and the first inversion local line LIO1B according to the data on the first global line GIO1 in response to the first write enable signal BWEN<1> which is enabled. The second data I/O circuit 172 may sense and amplify data on the second local line LIO2 and the second inversion local line LIO2B in response to the second read enable signal IOSAEN<2> which is enabled.

Subsequently, if the second mask write operation is performed during a third time period TD3 between a point of time T5 and a point of time T6, the first write enable signal BWEN<1> disabled to have a logic low level and the first read enable signal IOSAEN<1> enabled to have a logic high level may be generated in response to the first internal mask signal IDM<1> which is enabled to a logic high level and the second write enable signal BWEN<2> enabled to have a logic high level and the second read enable signal IOSAEN<2> disabled to have a logic low level may be generated in response to the second internal mask signal IDM<2> which is disabled to have a logic low level. The first data I/O circuit 171 may sense and amplify data on the first local line LIO1 and the first inversion local line LIO1B in response to the first read enable signal IOSAEN<1> which is enabled. The second data I/O circuit 172 may drive the second local line LIO2 and the second inversion local line LIO2B according to the data on the second global line GIO2 in response to the second write enable signal BWEN<2> which is enabled.

Subsequently, if the read operation is performed during a fourth time period TD4 between a point of time T7 and a point of time T8, the first read enable signal IOSAEN<1> and the second read enable signal IOSAEN<2> which are enabled may be generated. The first data I/O circuit 171 may sense and amplify data on the first local line LIO1 and the first inversion local line LIO1B in response to the first read enable signal IOSAEN<1> which is enabled. The second data I/O circuit 172 may sense and amplify data on the second local line LIO2 and the second inversion local line LIO2B in response to the second read enable signal IOSAEN<2> which is enabled.

As described above, the first local line LIO1 and the first inversion local line LIO1B may be driven by the first data I/O circuit 171 if the first mask write operation is performed, but the second local line LIO2 and the second inversion local line LIO2B may be coupled to bit lines to share electric charges. A bit line sense amplifier coupled to the bit lines may have an insufficient drivability to fully sense and amplify the data on the second local line and the second inversion local line. Hence, during the first mask write operation, a sense amplification circuit used in a read operation may be forcibly enabled to successfully sense and amplify data on the second local line and the second inversion local line without any errors.

The second semiconductor device 12 or the semiconductor system described with reference to FIGS. 1 to 9 may be applied to an electronic system that includes a memory system, a graphic system, a computing system, a mobile system, or the like. For example, referring to FIG. 10, an electronic system 1000 according an embodiment may include a data storage 1001, a memory controller 1002, a buffer memory 1003, and an input/output (I/O) interface 1004.

The data storage 1001 may store data which are outputted from the memory controller 1002 or may read and output the stored data to the memory controller 1002, according to a control signal generated from the memory controller 1002. The data storage 1001 may include the second semiconductor device 12 illustrated in FIG. 1. The data storage 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

Figure 10:
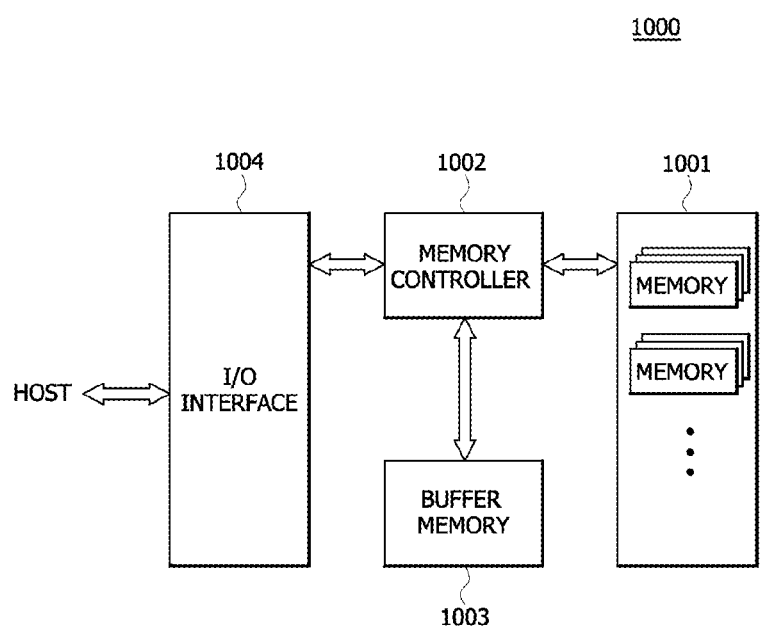
FIG. 10 is a block diagram illustrating a representation of an example of a configuration of an electronic system employing the semiconductor device or the semiconductor device described with reference to FIGS. 1 to 9.

The memory controller 1002 may receive a command outputted from an external device (e.g., a host device) through the I/O interface 1004 and may decode the command outputted from the host device to control an operation for inputting data into the data storage 1001 or the buffer memory 1003 or for outputting the data stored in the data storage 1001 or the buffer memory 1003. The memory controller 1002 may include the first semiconductor device 11 illustrated in FIG. 1. Although FIG. 10 illustrates the memory controller 1002 with a single block, the memory controller 1002 may include one controller for controlling the data storage 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor system comprising:
    a first semiconductor device suitable for outputting a command and a mask command; and
    a second semiconductor device suitable for driving a first local line according to data on a first global line and suitable for sensing and amplifying data on a second local line, if a first mask write operation is performed in response to the command and the mask command.

2. The system of claim 1, wherein the first mask write operation blocks an operation of driving the second local line according to data on the second global line.

3. The system of claim 1, wherein the second semiconductor device senses and amplifies data on the first local line and drives the second local line according to data on a second global line, if a second mask write operation is performed in response to the command and the mask command.

4. The system of claim 3, wherein the second mask write operation blocks an operation of driving the first local line according to data on the first global line.

5. The system of claim 1, wherein the second semiconductor device drives the first local line according to data on the first global line and drives the second local line according to data on the second global line, if a write operation is performed in response to the command and the mask command.

6. The system of claim 1, wherein the second semiconductor device senses and amplifies data on the first local line and senses and amplifies data on the second local line, if a read operation is performed in response to the command and the mask command.

7. The system of claim 1, wherein the second semiconductor device includes a control signal generation circuit that is suitable for generating a first write enable signal, a second write enable signal, a first read enable signal and a second read enable signal in response to a write signal, a read signal and an internal mask signal.

8. The system of claim 7, wherein the control signal generation circuit drives the first local line according to data on the first global line by enabling the first write enable signal and senses and amplifies data on the second local line by enabling the second read enable signal, if the first mask write operation is performed.

9. The system of claim 7, wherein the control signal generation circuit senses and amplifies data on the first local line by enabling the first read enable signal and drives the second local line according to data on a second global line by enabling the second write enable signal, if a second mask write operation is performed.

10. The system of claim 1, wherein the second semiconductor device includes a first data input/output circuit that is suitable for driving the first local line according to data on the first global line in response to a first write enable signal and suitable for sensing and amplifying data on the first local line in response to a first read enable signal.

11. The system of claim 10,
    wherein the first write enable signal is enabled during the first mask write operation or a write operation; and
    wherein the first read enable signal is enabled during a second mask write operation or a read operation.

12. The system of claim 10, wherein the first data input/output circuit includes:
    a first write driver suitable for driving the first local line according to data on the first global line in response to the first write enable signal; and
    a first sense amplification circuit suitable for sensing and amplifying the first local line in response to the first read enable signal.

13. The system of claim 10, wherein the second semiconductor device further includes a second data input/output circuit that is suitable for driving the second local line according to data on a second global line in response to a second write enable signal and suitable for sensing and amplifying data on the second local line in response to a second read enable signal.

14. The system of claim 13,
    wherein the second write enable signal is enabled during a second mask write operation or a write operation; and
    wherein the second read enable signal is enabled during the first mask write operation or a read operation.

15. The device of claim 13, wherein the second data input/output circuit includes:
    a second write driver suitable for driving the second local line according to data on the second global line in response to the second write enable signal; and
    a second sense amplification circuit suitable for sensing and amplifying data on the second local line in response to the second read enable signal.

16. A semiconductor device comprising:
    a control signal generation circuit suitable for generating a first write enable signal, a second write enable signal, a first read enable signal and a second read enable signal in response to a write signal, a read signal and an internal mask signal; and
    a data input/output circuit suitable for driving first and second local lines according to data on first and second global lines in response to the first and second write enable signals and suitable for sensing and amplifying data on the first and second local lines in response to the first and second read enable signals,
    wherein, if a first mask write operation is performed, the data input/output circuit drives the first local line according to data on the first global line in response to the first write enable signal and senses and amplifies data on the second local line in response to the second read enable signal.

17. The device of claim 16, wherein, if a second mask write operation is performed, the data input/output circuit senses and amplifies data on the first local line in response to the first read enable signal and drives the second local line according to data on the second global line in response to the second write enable signal.

18. The device of claim 16, wherein the data input/output circuit includes:
    a first data input/output circuit suitable for driving the first local line according to data on the first global line in response to the first write enable signal and suitable for sensing and amplifying data on the first local line in response to the first read enable signal; and a second data input/output circuit suitable for driving the second local line according to data on the second global line in response to the second write enable signal and suitable for sensing and amplifying data on the second local line in response to the second read enable signal.

19. A semiconductor device comprising:

a first data input/output circuit suitable for driving a first local line according to data on a first global line in response to a first write enable signal and suitable for sensing and amplifying data on the first local lines in response to a first read enable signal; and a second data input/output circuit suitable for driving a second local line according to data on a second global line in response to a second write enable signal and suitable for sensing and amplifying data on the second local line in response to a second read enable signals, wherein the first write enable signal and the second read enable signal are enabled if a first mask write operation is performed.

20. The device of claim 19, wherein the first read enable signal and the second write enable signal are enabled if a second mask write operation is performed.

\* \* \* \* \*